(12) United States Patent
Matsubara et al.

(10) Patent No.: US 6,936,926 B2
(45) Date of Patent: Aug. 30, 2005

(54) WIRING STRUCTURE IN A SEMICONDUCTOR DEVICE

(75) Inventors: Yoshihisa Matsubara, Tokyo (JP); Norio Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/372,089

(22) Filed: Feb. 25, 2003

(65) Prior Publication Data

US 2003/0160328 A1 Aug. 28, 2003

(30) Foreign Application Priority Data

Feb. 27, 2002 (JP) .................................... 2002-051803

(51) Int. Cl.⁷ .............................................. H01L 23/48
(52) U.S. Cl. ...................... 257/774; 257/773; 257/775
(58) Field of Search ................................ 257/758, 773, 257/774; 438/629, 634–640, 666, 668, 672, 675

(56) References Cited

U.S. PATENT DOCUMENTS

| | | | | |
|---|---|---|---|---|
| 6,016,012 A | * | 1/2000 | Chatila et al. | 257/775 |
| 6,037,001 A | * | 3/2000 | Kaloyeros et al. | 427/250 |
| 6,066,558 A | * | 5/2000 | Kawano et al. | 438/642 |
| 6,075,292 A | * | 6/2000 | Noguchi | 514/12 |
| 6,096,651 A | * | 8/2000 | Wang et al. | 438/691 |
| 6,106,899 A | * | 8/2000 | Nakagawa et al. | 427/327 |
| 6,143,658 A | * | 11/2000 | Donnelly et al. | 438/687 |
| 6,180,531 B1 | * | 1/2001 | Matsumoto et al. | 438/706 |
| 6,187,673 B1 | * | 2/2001 | Lai et al. | 438/643 |
| 6,211,073 B1 | * | 4/2001 | Ahn et al. | 438/653 |
| 6,246,105 B1 | * | 6/2001 | Morozumi et al. | 257/640 |
| 6,387,444 B1 | * | 5/2002 | Okada et al. | 427/250 |
| 6,436,810 B1 | * | 8/2002 | Kumar et al. | 438/633 |
| 6,444,566 B1 | * | 9/2002 | Tsai et al. | 438/624 |
| 6,475,912 B1 | * | 11/2002 | Harada | 438/687 |
| 6,504,229 B2 | * | 1/2003 | Yamauchi et al. | 257/532 |
| 6,511,609 B2 | * | 1/2003 | Jan et al. | 216/87 |
| 6,812,127 B2 | * | 11/2004 | Oshima et al. | 438/622 |
| 2001/0006701 A1 | * | 7/2001 | Kobayashi et al. | 427/99 |
| 2002/0050459 A1 | * | 5/2002 | Matsuda et al. | 205/118 |
| 2002/0125577 A1 | * | 9/2002 | Komada | 257/774 |

FOREIGN PATENT DOCUMENTS

JP 2001-298084 10/2001

* cited by examiner

*Primary Examiner*—Long Pham
*Assistant Examiner*—Thao X. Le
(74) *Attorney, Agent, or Firm*—Young & Thompson

(57) ABSTRACT

A wiring structure includes a first wiring having a first wiring width, and a second wiring formed in the same layer as a layer in which the first wiring is formed, and having a second wiring width greater than the first wiring width. The second wiring is electrically connected to the first wiring. Both of the first and second wirings are composed of copper or an alloy predominantly containing copper therein. The first and second wirings have the same thickness as each other. A ratio of an area of the second wiring to an area of the first wiring is N:1 where N is equal to or greater than 2,000 and equal to or smaller than 200,000,000 ($2,000 \leq N \leq 200,000,000$).

8 Claims, 17 Drawing Sheets

⊢———⊣ 100nm

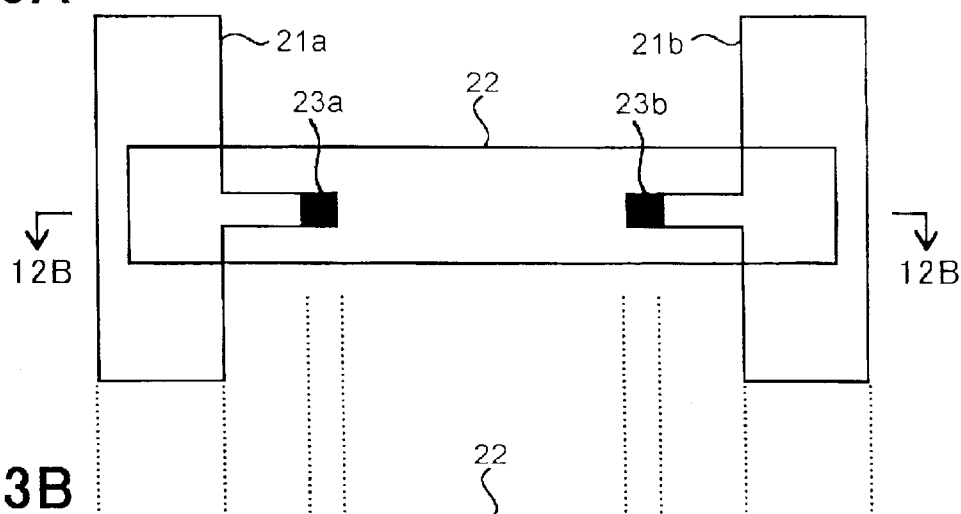
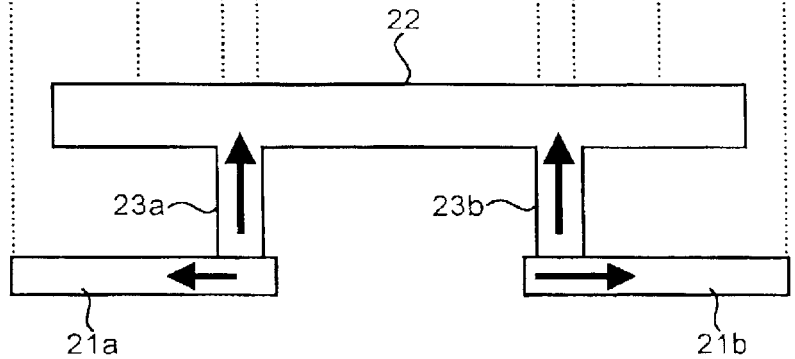
FIG.13A
FIG.13B

WIRING STRUCTURE IN A SEMICONDUCTOR DEVICE

BACKGROUND OF THE INVENTION

1. Field of the Invention

The invention relates to a wiring structure and a semiconductor device including the wiring structure, and more particularly to a dual-damascene wiring structure and a semiconductor device including the dual-damascene wiring structure.

2. Description of the Related Art

In a conventional semiconductor device, a metal wire has been usually composed of aluminum or aluminum alloy. This is because aluminum and aluminum alloy can be readily patterned through the use of a photoresist mask and etching gas, since aluminum and aluminum alloy have a low resistivity.

In these days, with reduction in a size of a semiconductor device and increase in an operation rate of a semiconductor device, there is a need for a material of which a wiring is to be composed and which has a lower resistivity and a higher current density than aluminum and aluminum alloy. As a material meeting with such requirements, copper (Cu) draws much attention.

When a copper wiring is to be patterned, if a copper wiring is etched in the same manner as an aluminum wiring, copper is harmfully affected by etching gas and moisture, resulting in that corrosion occurs inside the copper wiring. Accordingly, unlike an aluminum wiring, it is not suitable to pattern a copper wiring through the use of a photoresist mask and etching gas.

As a method of patterning a copper wiring without occurrence of corrosion, there is known a damascene process. A damascene process is a process for forming a copper wiring on an underlying layer, including steps of forming a recess with an underlying layer, filling the recess with copper, and polishing the copper for removal of unnecessary portions of the copper.

When an upper wiring layer and a lower wiring layer are electrically connected to each other in a multi-wiring layer structure, a via-hole is formed throughout an interlayer insulating film sandwiched between the upper and lower wiring layers, and then, a via-conductor is formed by filling the via-hole with electrical conductor such as metal. The upper and lower wiring layers are electrically connected to each other through the thus formed via-conductor.

In this process, if the upper wiring layer and the via-conductor were formed in separate steps, a time necessary for fabricating a multi-layer wiring structure would be increased. Hence, a dual-damascene process is generally used in order to shorten the above-mentioned fabrication time. Herein, a dual-damascene process is a process including steps of filling both of a via-hole formed with an interlayer insulating film and a recess formed with an upper wiring layer with metal in a single common step, and polishing the metal such that the metal remains only in the via-hole and the recess, to thereby form a via-conductor.

In a dual-damascene process, a via-conductor is generally composed of copper, similarly to a damascene process.

It is known that a copper plating film has a lot of voids at a size of 10 nm or so. Such voids are agglomerated by migration, gather at a grain boundary, and develop into a larger void.

A plated copper has a grain larger than the same in a film formed by sputtering. As a result, grain having superior crystalline can be formed in plated copper. Such grain having superior crystalline is more likely to be formed in a wiring layer having a greater width. This is because crystalline is degraded by a sidewall of a wiring layer. As a result, a wiring layer having a small width often has inferior crystalline relative to a wiring layer having a great width. The inventors found out that such difference in crystalline presented the following facts by which voids were caused.

(a) Voids are more likely to be diffused in a wiring layer having a greater width than in a wiring layer having a smaller width, because of superiority in crystalline of a wiring layer having a greater width relative to the same of a wiring layer having a smaller width.

(b) Since a wiring layer having a greater width has superiority in crystalline relative to the same of a wiring layer having a smaller width, a wiring layer having a greater width has free energy smaller than that of a wiring layer having a smaller width.

(c) Since a wiring layer having a greater width has superiority in crystalline relative to the same of a wiring layer having a smaller width, grains a wiring layer having a smaller width are thermally instable than a wiring layer having a greater width with respect to surface energy.

Due to the above-mentioned three facts, there occurs a phenomenon in which a volume moves towards a wiring layer having a great width from a wiring layer having a small width in dependence on annealing and a size. This phenomenon is called agglomeration.

The inventors found out that it would be effective to restrict energy gradient in order to solve the agglomeration. Thus, the inventors present a solution to the problem that agglomeration occurs because a wiring layer is connected to a thin wiring or a small via-contact in dependence on an area or a volume of the wiring layer.

Copper tends to be agglomerated, if annealed at a high temperature. For instance, if a thin copper film were annealed at a high temperature, the thin copper film would be agglomerated into a small circular piece. A thinner copper film is more likely to be agglomerated. A thin copper film having been agglomerated is no longer able to be used as a material of which a copper wiring is composed. This is because, if a copper film were agglomerated, the copper film would contain void, and resultingly, would have wiring defects such as breakage.

Hereinbelow are explained examples of wiring defects observed in a copper wiring fabricated in accordance with a conventional dual-damascene process.

FIG. 1A is a cross-sectional view illustrating a first example of a multi-layered wiring structure composed of copper.

First, a recess is formed at a surface of a lower insulating layer 104, and then, a lower copper wiring layer 105 is formed in the recess.

The lower copper wiring layer 105 is formed as follows, for instance.

First, a barrier metal layer is deposited on an inner wall of the recess by sputtering. Then, the recess is filled with copper by electrolytic plating. Then, copper deposited on the lower insulating layer 104 is removed by chemical mechanical polishing (CMP). Thus, the lower copper wiring layer 105 is formed just in the recess.

After the formation of the lower copper wiring layer 105, a silicon nitride (SiN) layer 106, a silicon dioxide ($SiO_2$) layer 107, a silicon nitride (SiN) layer 116 and a silicon dioxide ($SiO_2$) layer 117 are formed as an interlayer insulating layer on the lower insulating layer 104 and the lower copper wiring layer 105.

Then, the interlayer insulating layer is formed with a via-hole 108. The thus formed via-hole 108 is filled with resist. Thereafter, the silicon nitride (SiN) layer 116 and the silicon dioxide (SiO$_2$) layer 117 are removed in selected areas to thereby form a second recess in which an upper wiring layer is to be formed.

Then, while the second recess and the via-hole 108 are kept exposed, a via-conductor 109 and an upper wiring layer 110 are formed in a common step. For instance, a barrier metal layer is deposited on inner walls of the second recess and the via-hole 108 by sputtering, and then, a copper layer is formed over the barrier metal layer by electrolytic plating. Copper deposited on the silicon dioxide (SiO$_2$) layer 117 is polished for removal.

Thus, there is formed a dual-damascene wiring comprised of the via-conductor 109 and the upper wiring layer 110.

Then, an upper insulating layer comprised of a silicon nitride (SiN) layer 111 and a silicon dioxide (SiO$_2$) layer 112 is formed on the upper wiring layer 110.

As explained above, in a dual-damascene multi-layered wiring structure, the via-conductor 109 through which the lower wiring layer 105 and the upper wiring layer 110 are electrically connected to each other is composed of the same material as a material of which the upper wiring layer 110 is composed. For instance, in the first example illustrated in FIG. 1A, both of the via-conductor 109 and the upper wiring layer 110 are composed of copper.

The above-mentioned dual-damascene multi-layered wiring structure is accompanied with a problem of void caused by the above-mentioned migration of copper. Examples of void are illustrated in FIGS. 1B, 1C and 1D.

FIG. 1B illustrates an example in which void 120B is observed almost at the center of the via-hole 108. The void 120B observed almost at the center of the via-hole 108 electrically insulates the lower wiring layer 105 and the upper wiring layer 110 from each other.

FIG. 1C illustrates an example in which void 120C is observed at a bottom of the via-hole 108. The void 120C observed at a bottom of the via-hole 108 electrically insulates the lower wiring layer 105 and the upper wiring layer 110 from each other, similarly to the void 120B illustrated in FIG. 1B.

FIG. 2 is a photograph of void generated at a bottom of a via-hole, taken through an electron-microscope.

FIG. 1D illustrates an example in which void 120D is observed at the side of the lower wiring layer 105 at a boundary between the via-conductor 109 and the lower wiring layer 105. Though the void 120D is not generated inside the via-hole 108 unlike the voids 120B and 120C illustrated in FIGS. 1B and 1C, the void 120D electrically insulates the lower wiring layer 105 and the upper wiring layer 110 from each other, similarly to the voids 120B and 120C illustrated in FIGS. 1B and 1C.

FIGS. 1A to 1C illustrate examples of voids observed in a multi-layered wiring structure which is a three-dimensional structure. Void is generated not only in a three-dimensional multi-layered wiring structure, but also in a two-dimensional planar structure.

FIG. 3 is a plan view illustrating an example of a copper wiring structure.

As illustrated in FIG. 3, a first wiring layer 121 having a first wiring width W1 and a second wiring layer 122 having a second wiring width W2 greater than the first wiring width W1 are electrically connected to each other. The first wiring layer 121 and the second wiring layer 122 are formed in a common layer, and have the same thickness as each other. The first wiring layer 121 and the second wiring layer 122 are composed of copper.

In the copper wiring structure illustrated in FIG. 3, if a volume of the second wiring layer 122 is significantly greater than a volume of the first wiring layer 121 (since the first wiring layer 121 and the second wiring layer 122 have the same thickness, "a volume" may be replaced with "an area"), copper is agglomerated inside the first wiring layer 121. As a result, a tensile stress 123 directing towards the second wiring layer 122 from the first wiring layer 121 is generated, and thus, the second wiring layer 122 is absorbed into the first wiring layer 121.

As a result, void 124 is generated at an end of the first wiring layer 121.

As explained so far, in both of a three-dimensional multi-layered wiring structure and a two-dimensional planar wiring structure both fabricated through a dual-damascene process, void is generated due to migration of copper of which a wiring layer is composed, and the thus generated void causes electrical insulation between wiring layers.

Thus, many wiring structures have been suggested so far to avoid void caused by copper migration.

As an example of such a wiring structure, FIGS. 4A and 4B illustrate a damascene wiring structure suggested in Japanese Unexamined Patent Publication No. 2001-298084 (A).

FIG. 4A is an upper plan view of the damascene wiring structure suggested in the above-mentioned Publication, and FIG. 4B is a cross-sectional view taken along the line 4B—4B in FIG. 4A.

The illustrated damascene wiring structure is comprised of a lower wiring layer 130, an interlayer insulating film 131 formed on the lower wiring layer 130, and an upper wiring layer. 132 (illustrated with a broken line) formed on the interlayer insulating film 131.

The interlayer insulating film 131 is formed at a surface thereof with a recess 131a, and further formed at a bottom of the recess 131a with a via-hole 133 reaching the lower wiring layer 130. The via-hole 133 has a diameter smaller than a width of the recess 131a.

Around the via-hole 133 are formed four projections 134 upwardly projecting from a bottom of the recess 131a. The projections 134 are composed of the same material as a material of which the interlayer insulating film 131 is composed.

It is alleged in the above-mentioned Publication that the damascene wiring structure illustrated in FIGS. 4A and 4B can avoid defects caused by stress migration, typically such void generated in a copper wiring as mentioned above, even if a wiring had a long width, that is, a large volume.

However, the damascene wiring structure illustrated in FIGS. 4A and 4B is accompanied with a problem that it has to carry out complex photolithography and etching steps in order to form the projections 134, resulting in reduction in a fabrication yield.

In addition, since the projections 134 extend into the upper wiring layer 132 in the damascene wiring structure illustrated in FIGS. 4A and 4B, it would be quite difficult to estimate a resistance of the upper wiring layer 132, and to analyze current concentration occurring in the upper wiring layer 132.

SUMMARY OF THE INVENTION

In view of the above-mentioned problems in the conventional wiring structure, it is an object of the present invention to provide a copper wiring structure which is capable of avoiding generation of void caused by copper migration, and further avoiding electrical insulation between wiring layers.

Herein, a copper wiring structure includes not only a three-dimensional multi-layered wiring structure, but also a two-dimensional planar wiring structure. Such a copper wiring structure is applicable to a semiconductor device, for instance.

In one aspect of the present invention, there is provided a wiring structure including (a) a first wiring having a first wiring width, and (b) a second wiring formed in the same layer as a layer in which the first wiring is formed, and having a second wiring width greater than the first wiring width, the second wiring being electrically connected to the first wiring, wherein both of the first and second wirings are composed of copper or an alloy predominantly containing copper therein, the first and second wirings have the same thickness as each other, and a ratio of an area of the second wiring to an area of the first wiring is N:1 where N is equal to or greater than 2,000 and equal to or smaller than 200,000,000 (2,000≦N≦200,000,000).

As will be explained in detail later, if the first and second wirings have the same thickness as each other, it is possible to avoid migration of copper in the first wiring, and hence, generation of void in the first wiring, by setting the area ratio N equal to or greater than 2,000 and equal to or smaller than 200,000,000 (2,000≦N≦200,000,000).

In accordance with the above-mentioned wiring structure, it is not necessary to form such a pattern as the projections 134 of the damascene wiring structure suggested in the above-mentioned Japanese Unexamined Patent Publication No. 2001-298084. Hence, it is possible to avoid copper migration in a thin wiring layer through simplified fabrication steps.

It is preferable that the area ratio N is equal to or greater than 2,000 and equal to or smaller than 2,000,000 (2,000≦N≦2,000,000).

It is preferable that each of the first and second wirings has a thickness equal to or greater than 150 nm and equal to or smaller than 650 nm.

For instance, the first wiring width may be designed to be equal to or smaller than 0.28 micrometers, 0.20 micrometers, 0.14 micrometers or 98 nanometers.

As an alternative, the first wiring width may be designed to be in the range of 0.28±0.04 micrometers, 0.20±0.04 micrometers, 0.14±0.04 micrometers or 98±0.04 nanometers.

If the second wiring width is equal to or greater than 1.12 micrometers and the first wiring has a length equal to or smaller than 0.56 micrometers, it is preferable that the first wiring width is equal to or greater than 0.28 micrometers.

There are suitable combinations in a width and a length of the first wiring.

For instance, it is preferable that the first wiring width is equal to 0.14 micrometers, and the first wiring has a length equal to or greater than about 0.40 micrometers.

As an alternative, it is preferable that the first wiring width is equal to 0.20 micrometers, and the first wiring has a length equal to or greater than about 0.20 micrometers.

As an alternative, it is preferable that the first wiring width is equal to 0.28 micrometers, and the first wiring has a length equal to or greater than about 0.19 micrometers.

One of parameters for suppressing copper migration is a temperature at which copper is to be annealed. In accordance with the experiments the inventors had conducted, it was found out that it was preferable that the first and second wirings were annealed at a temperature of 150 degrees centigrade or higher, if the first and second wirings were composed of copper.

It was also found out that a wiring layer might be annealed at a lower temperature by mixing metals other than copper with copper of which a wiring layer is composed, that is, by composing a wiring layer of copper alloy. Hence, if the first and second wirings are composed of an alloy predominantly containing copper therein, the first and second wirings may be annealed at a temperature higher than a temperature at which the first and second wirings are annealed if the first and second wirings are composed of copper.

The wiring structure may be designed to have a dual-damascene structure.

There is further provided a wiring structure including an upper wiring layer, and a lower wiring layer electrically connected to the upper wiring layer through a via-contact, wherein all of the upper wiring layer, the lower wiring layer and the via-contact are composed of copper or an alloy predominantly containing copper therein, and a ratio of a volume of the upper or lower wiring layer to a volume of the via-contact is N:1 where N is equal to or greater than 3 and equal to or smaller than 200,000,000 (3≦N≦200,000,000).

As will be explained in detail later, if the first and second wirings have different thicknesses from each other, it is possible to avoid migration of copper in the first wiring, and hence, generation of void in the first wiring, by setting the area ratio N equal to or greater than 3 and equal to or smaller than 200,000,000 (3≦N≦200,000,000).

In accordance with the above-mentioned wiring structure, it is not necessary to form such a pattern as the projections 134 of the damascene wiring structure suggested in the above-mentioned Japanese Unexamined Patent Publication No. 2001-298084. Hence, it is possible to avoid copper migration in a thin wiring layer through simplified fabrication steps.

It is preferable that the volume ratio N is equal to or greater than 2,000 and equal to or smaller than 2,000,000 (2,000≦N≦2,000,000).

There is further provided a wiring structure including an upper wiring layer, and a lower wiring layer electrically connected to the upper wiring layer through a via-contact, wherein all of the upper wiring layer, the lower wiring layer and the via-contact are composed of copper or an alloy predominantly containing copper therein, and assuming that a ratio of a volume of the upper or lower wiring layer to a volume of the via-contact is N:1, if the ratio N is equal to or greater than 3.5 and equal to or smaller than 2,000,000 (3.5≦N≦2,000,000), the upper wiring layer is electrically connected to the lower wiring layer through at least two via-contacts.

The via-contact may be designed to have a circular cross-section as well as a square cross-section.

When the via-contact is designed to have a circular cross-section, it is preferable that the via-contact has a diameter equal to or smaller than 0.28 micrometers, it is more preferable that the via-contact has a diameter equal to or smaller than 0.20 micrometers, it is further more preferable that the via-contact has a diameter equal to or smaller than 0.14 micrometers, and it is most preferable that the via-contact has a diameter equal to or smaller than 98 nanometers.

The above-mentioned diameters of the via-contact may have tolerance of ±0.04 micrometers. Specifically, when the via-contact is designed to have a circular cross-section, a diameter of the via-contact is preferably 0.28±0.04 micrometers, more preferably 0.20±0.04 micrometers, further more preferably 0.14±0.04 micrometers, and most preferably 98 nanometers ±0.04 micrometers.

There is still further provided a wiring structure including an upper wiring layer, and a lower wiring layer electrically connected to the upper wiring layer through a via-contact, wherein all of the upper wiring layer, the lower wiring layer and the via-contact are composed of copper or an alloy predominantly containing copper therein, and assuming that a ratio of a volume of the upper or lower wiring layer to a volume of the via-contact is N:1, if the via-contact has a circular cross-section having a diameter of 0.14±0.04 micrometers, the ratio N is equal to or smaller than three (3).

There is yet further provided a wiring structure including an upper wiring layer, and a lower wiring layer electrically connected to the upper wiring layer through a via-contact, wherein all of the upper wiring layer, the lower wiring layer and the via-contact are composed of copper or an alloy predominantly containing copper therein, and assuming that a ratio of a volume of the upper or lower wiring layer to a volume of the via-contact is N:1, if the via-contact has a circular cross-section having a diameter of 0.20±0.04 micrometers, the ratio N is equal to or smaller than nine (9).

There is still yet further provided a wiring structure including an upper wiring layer, and a lower wiring layer electrically connected to the upper wiring layer through a via-contact, wherein all of the upper wiring layer, the lower wiring layer and the via-contact are composed of copper or an alloy predominantly containing copper therein, and assuming that a ratio of a volume of the upper or lower wiring layer to a volume of the via-contact is N:1, if the via-contact has a circular cross-section having a diameter of 0.28±0.04 micrometers, the ratio N is equal to or smaller than fifteen (15).

It is preferable that the upper and lower wiring layers are annealed at a temperature equal to or higher than 150 degrees centigrade. If the upper and lower wiring layers are composed of an alloy predominantly containing copper therein, it is preferable that the upper and lower wiring layers are annealed at a temperature higher than a temperature at which the upper and lower wiring layers are annealed if the upper and lower wiring layers are composed of copper.

If the via-contact is designed to be square in a cross-section, it is preferable that a side of the via-contact is equal to or smaller than 3 micrometers.

There is further provided a wiring structure including an upper wiring layer, and a lower wiring layer electrically connected to the upper wiring layer through a via-contact, wherein all of the upper wiring layer, the lower wiring layer and the via-contact are composed of copper or an alloy predominantly containing copper therein, and a wiring width of each of said upper and lower wiring layers is defined by a maximum diameter of a circle inscribed with said via-contact, said circle having a center identical with a center of said via-contact.

For instance, it is preferable that the maximum wiring width is equal to 3 micrometers.

The wiring structure in accordance with the present invention is applicable to a semiconductor device, for instance.

The advantages obtained by the aforementioned present invention will be described hereinbelow.

The present invention makes it possible to avoid generation of void caused by migration of copper in the first wiring, and hence, further avoid electrical insulation between wiring layers not only in a three-dimensional multi-layered copper wiring structure, but also in a two-dimensional planar copper wiring structure. Accordingly, a device to which the wiring structure in accordance with the present invention is applied, such as a semiconductor device, could have enhanced reliability.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 13A is a plan view of a wiring structure in accordance with the second embodiment of the present invention.

FIG. 13B is a cross-sectional view taken along the line 12B—12B in FIG. 13A.

DESCRIPTION OF THE PREFERRED EMBODIMENTS

Preferred embodiments in accordance with the present invention will be explained hereinbelow with reference to drawings.

[First Embodiment]

Figure 5:
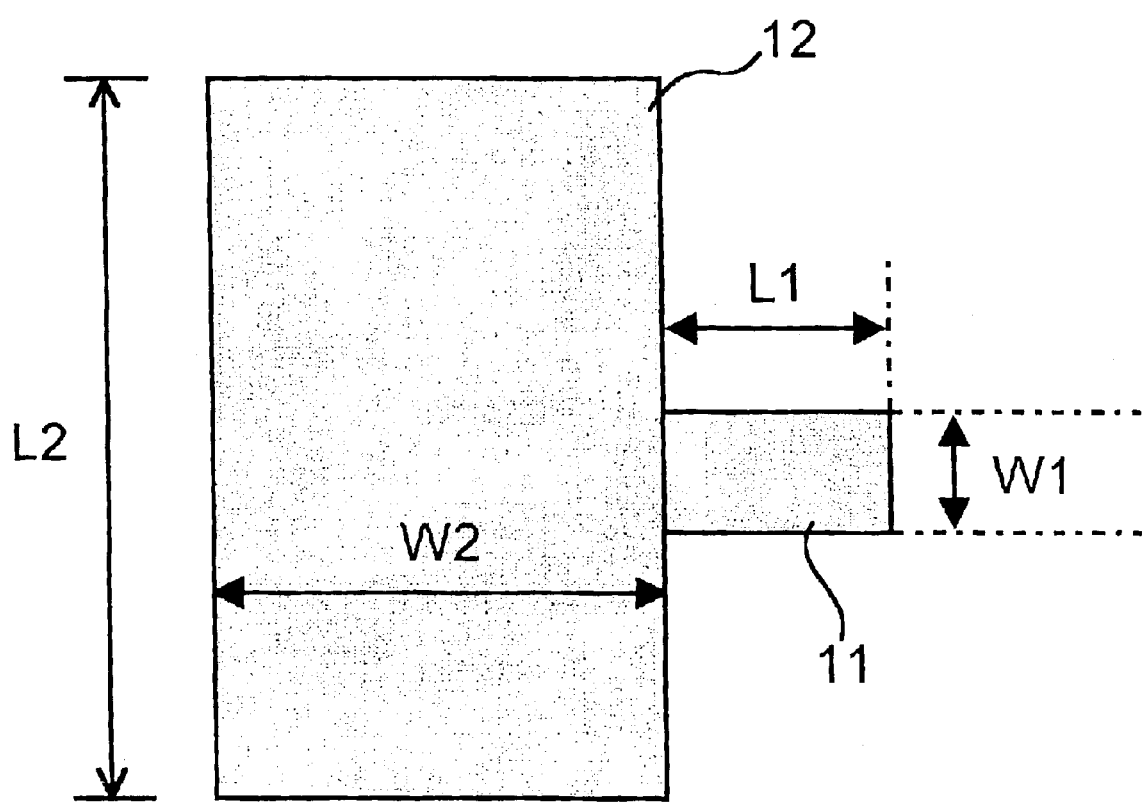
FIG. 5 is a plan view of a wiring structure in accordance with the first embodiment of the present invention.
Figure 6:
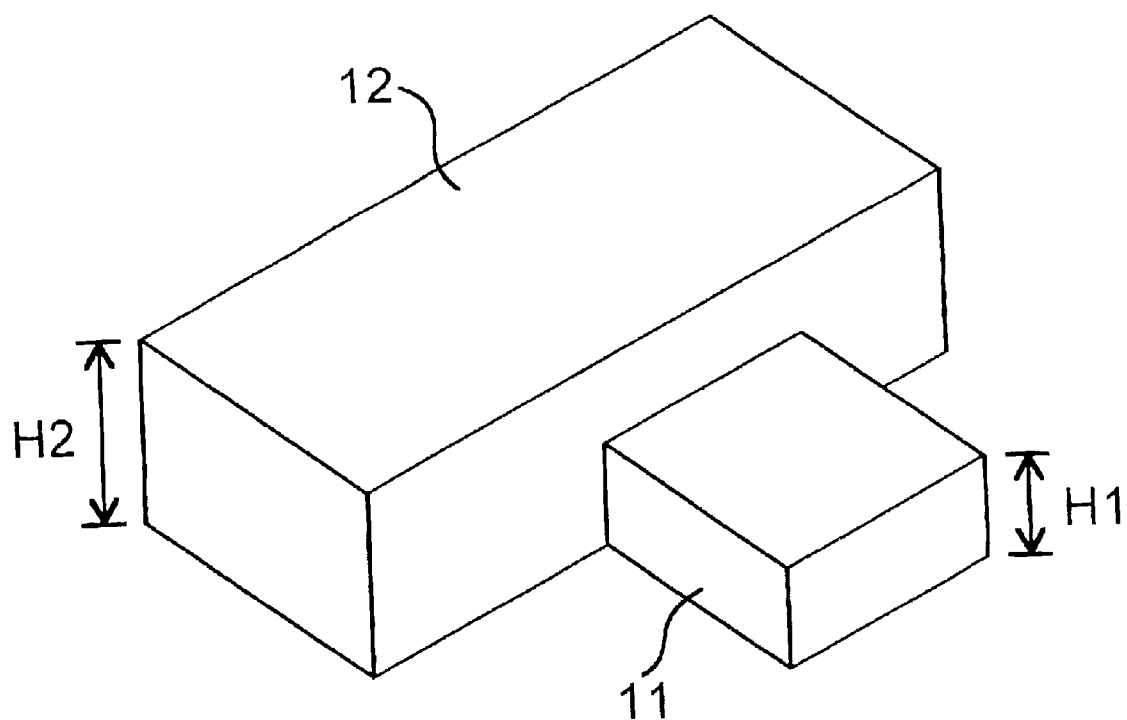
FIG. 6 is a perspective view of the wiring structure illustrated in FIG. 5.

FIG. 5 is an upper plan view of a wiring structure 10 in accordance with the first embodiment of the present invention, and FIG. 6 is a perspective view of the wiring structure 10 illustrated in FIG. 5.

For instance, the wiring structure 10 can be applied to a semiconductor device as a part of a planar wiring pattern.

The wiring structure 10 is comprised of a first wiring layer 11, and a second wiring layer 12 electrically and physically connected to the first wiring layer 11. The first and second wiring layers 11 and 12 are formed in a common layer, and both composed of copper (Cu).

As illustrated in FIGS. 5 and 6, the first wiring layer 11 has a length L1, a width W1 and a height H1, and the second wiring layer 12 has a length L2, a width W2 and a height H2. The width W2 of the second wiring layer 12 is greater than the width W1 of the first wiring layer 11 (W2>W1)

A volume V1 of the first wiring layer 11 and a volume V2 of the second wiring layer 12 are calculated as follows.

$$V1 = L1 \times W1 \times H1$$

$$V2 = L2 \times W2 \times H2$$

If the volume V2 is significantly greater than the volume V1 (V2>>V1), copper of which the first wiring layer 11 is composed is agglomerated, and hence, the first wiring layer 11 having the volume V1 is absorbed into the second wiring layer 12 having the volume V2, resulting generation of void at an end of the first wiring layer 11.

In view of this problem, the inventors had conducted the experiments in order to find a critical ratio between the volumes V1 and V2 at which copper of which the first wiring layer 11 is not agglomerated, that is, the first wiring layer 11 is not absorbed into the second wiring layer 12.

In accordance with the results of the experiments, it was found out that it was possible to avoid migration of copper in the first wiring layer 11, and hence, absorption of the first wiring layer 11 into the second wiring layer 12 by setting a ratio N equal to or greater than 2,000, but equal to or smaller than 200,000,000 (2,000≦N≦200,000,000) where the ratio N is defined as V2/V1.

It was also found out that an optimal range in the ratio N was 2,000 to 2,000,000 among the above-mentioned range of 2,000 to 200,000,000 in the ratio N.

Figure 7:
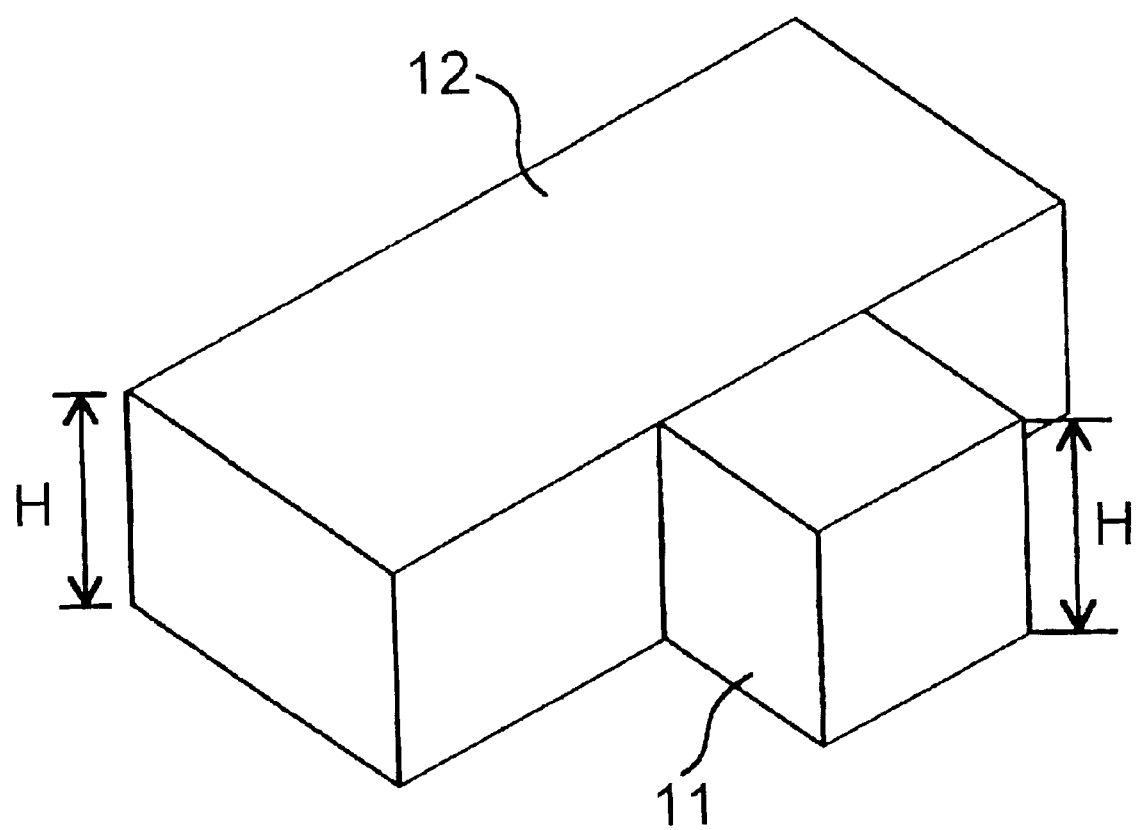
FIG. 7 is a perspective view of a variant of the wiring structure illustrated in FIG. 5.

As illustrated in FIG. 7, if the height H1 of the first wiring layer 11 and the height H2 of the second wiring layer 12 are set equal to a height H (H1=H2=H), the volume ratio N defined as V2/V1 is equivalent to an area ratio between areas of the first and second wiring layers 11 and 12. That is, the ratio N may be defined as L2·W2/L1·W1.

Accordingly, if the heights H1 and H2 are equal to a height H (H1=H2=H), the length L1 and the width W1 of the first wiring layer 11 and the length L2 and the width W2 of the second wiring layer 12 are determined so that the ratio N is defined as follows:

$$2{,}000 \leq N = L2 \cdot W2 / L1 \cdot W1 \leq 200{,}000{,}000.$$

Hereinbelow are explained the experiment for determining a range of the ratio N, and the results thereof.

Figure 8:
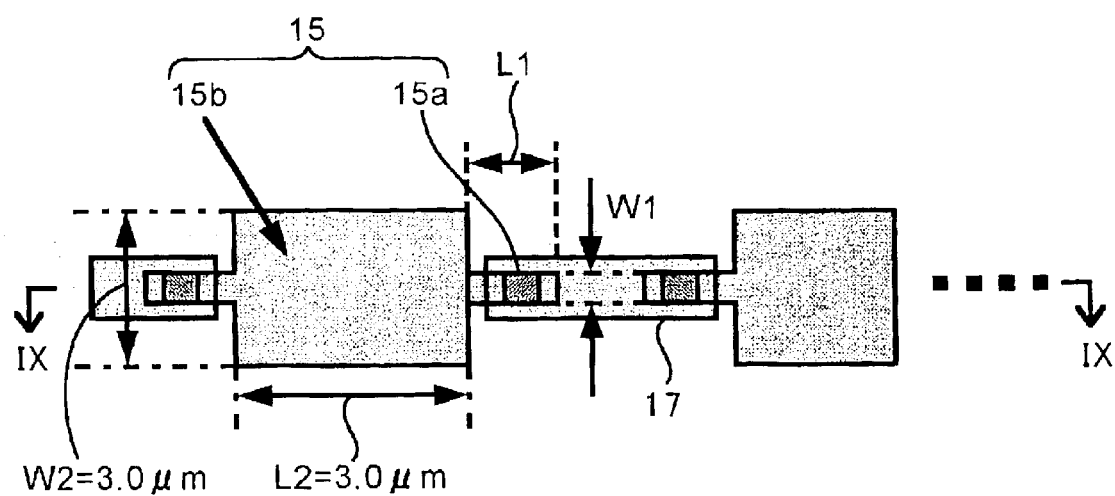
FIG. 8 is a plan view of a wiring structure used in the experiment.
Figure 9:
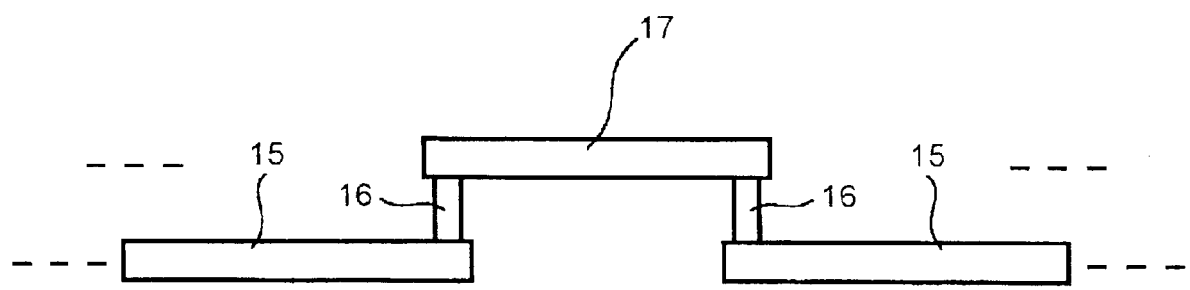
FIG. 9 is a cross-sectional view taken along the line IX—IX in FIG. 8.

FIG. 8 is a plan view of the wiring structure used in the experiment, and FIG. 9 is a cross-sectional view taken along the line IX—IX in FIG. 8.

As illustrated in FIG. 9, the experimental wiring structure was comprised of a plurality of lower wiring layers 15 arranged in a line, and a plurality of upper wiring layers 17 each arranged between the adjacent lower wiring layers 15, and each electrically connecting the adjacent lower wiring layers 15 to each other through via-holes 16.

Each of the lower wiring layers 15 was designed to have the same structure as the structure of the wiring structure 10 illustrated in FIGS. 5 and 7. Specifically, each of the lower wiring layers 15 was comprised of a first wiring layer 15a, and a second wiring layer 15b electrically and physically connected to the first wiring layer 15a. The first and second wiring layers 15a and 15b were formed in a common layer, and both composed of copper (Cu).

The second wiring layer 15b had a length L2 of 3.0 micrometers, and a width W2 of 3.0 micrometers.

On the other hand, a length L1 of the first wiring layer 15a was varied among 0.14 micrometers, 0.27 micrometers, 0.55 micrometers and 1.12 micrometers. In addition, a width W1 of the first wiring layer 15a was varied among 0.14 micrometers, 0.20 micrometers and 0.28 micrometers for each of the above-mentioned four lengths L1. That is, there were formed twelve wiring structures in which the first wiring layers 15a had different lengths L1 and widths W1 from one another.

Then, a non-defectiveness rate was measured for each of the twelve wiring structures.

Figure 10:
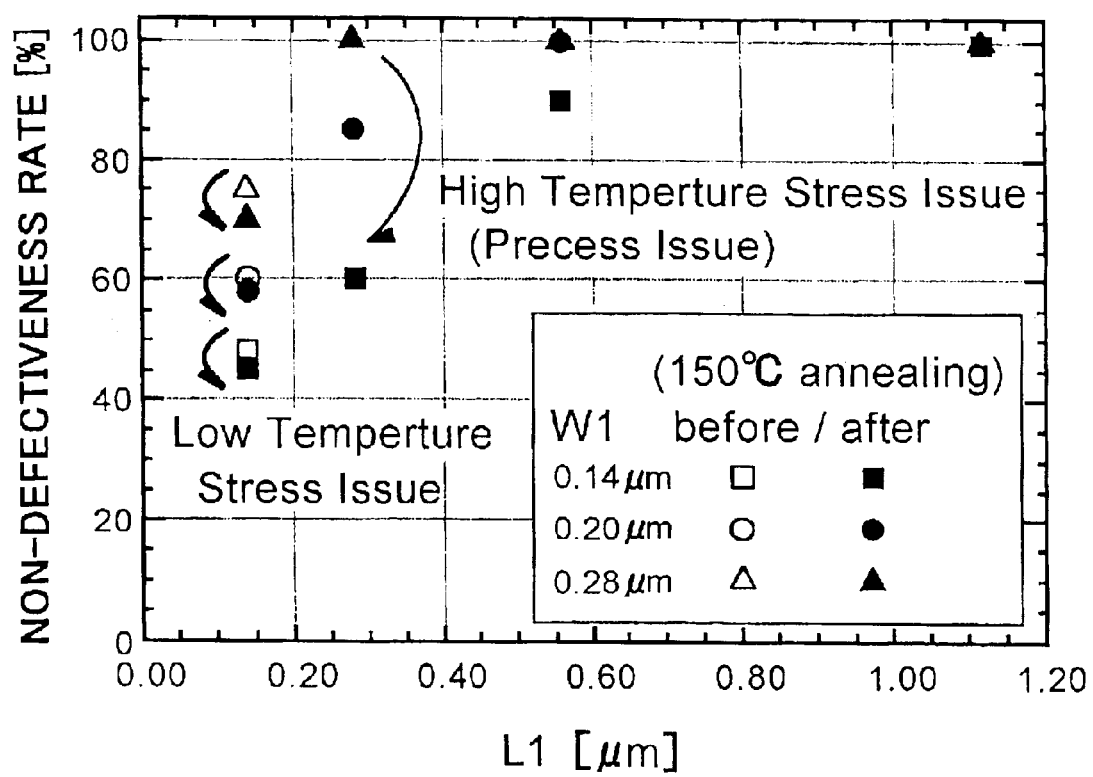
FIG. 10 is a graph showing the results of the experiment.

FIG. 10 is a graph showing a non-defectiveness rate in each of the twelve wiring structures.

As is obvious in view of FIG. 10, the greater the length L1 is, the higher a non-defectiveness rate is when the width W1 is set equal to either 0.14 micrometers, 0.20 micrometers or 0.28 micrometers.

If an allowable non-defectiveness rate is set equal to or greater than 80%, it is understood in view of FIG. 10 that the length L1 is necessary to be equal to or greater than about 0.40 micrometers, when the width W1 is set equal to 0.14 micrometers.

It is also understood in view of FIG. 10 that the length L1 is necessary to be equal to or greater than about 0.20 micrometers, when the width W1 is set equal to 0.20 micrometers, and that the length L1 is necessary to be equal to or greater than about 0.19 micrometers, when the width W1 is set equal to 0.28 micrometers.

It was further found out in the experiment that the first wiring layer 15a could have the width W1 equal to or smaller than 98 nanometers.

Though the width W1 was set equal to 0.14 micrometers, 0.20 micrometers, 0.28 micrometers or 98 nanometers in the above-mentioned experiment, it was also found out in the experiment that the width W1 had a tolerance of ±0.04 micrometers. Hence, the length L1 is necessary to be in the above-mentioned preferable ranges also when the width W1 is equal to 0.14±0.04 micrometers, 0.20±0.04 micrometers, 0.28±0.04 micrometers or 98 nanometers ±0.04 micrometers.

It was also found out that the width W1 of the first wiring layer 15a was preferably equal to or greater than 0.28 micrometers when the width W2 of the second wiring layer 15b was equal to or greater than 1.12 micrometers and the length L1 of the first wiring layer 15a was equal to or smaller than 0.56 micrometers.

For the wiring structure including the first wiring layer 15a having the length L1 of 0.14 micrometers, the wiring structure including the first wiring layer 15a before annealed and the wiring structure including the first wiring layer 15a having been annealed at 150 degrees centigrade were both measured with respect to a non-defectiveness rate. As is obvious in view of FIG. 10, a non-defectiveness rate is slightly lowered in the wiring structure including the first wiring layer 15a having been annealed at 150 degrees centigrade.

In view of the above-mentioned experimental results, the volume ratio N defined as V2/V1 is preferably in the range of 2,000 and 200,000,000 both inclusive, and more preferably in the range of 2,000 and 2,000,000 both inclusive.

As mentioned above, void is generated in the first wiring layer 11 or 15a due to migration of copper of which the first wiring layer 11 or 15a is composed. Copper is agglomerated in accordance with a plurality of parameters. One of such parameters is a temperature at which the first wiring layer is heated and a thickness of the first wiring layer.

Accordingly, the inventors had conducted the experiment to find such a temperature and a thickness at which copper is not agglomerated.

In the experiment, the first wiring layer 15a and the second wiring layer 15b were heated at room temperature (RT), 50 degrees centigrade, 100 degrees centigrade, 150 degrees centigrade, 200 degrees centigrade, 300 degrees centigrade and 400 degrees centigrade, and a distance between copper molecules was measured at each of the temperatures.

Figure 11A:
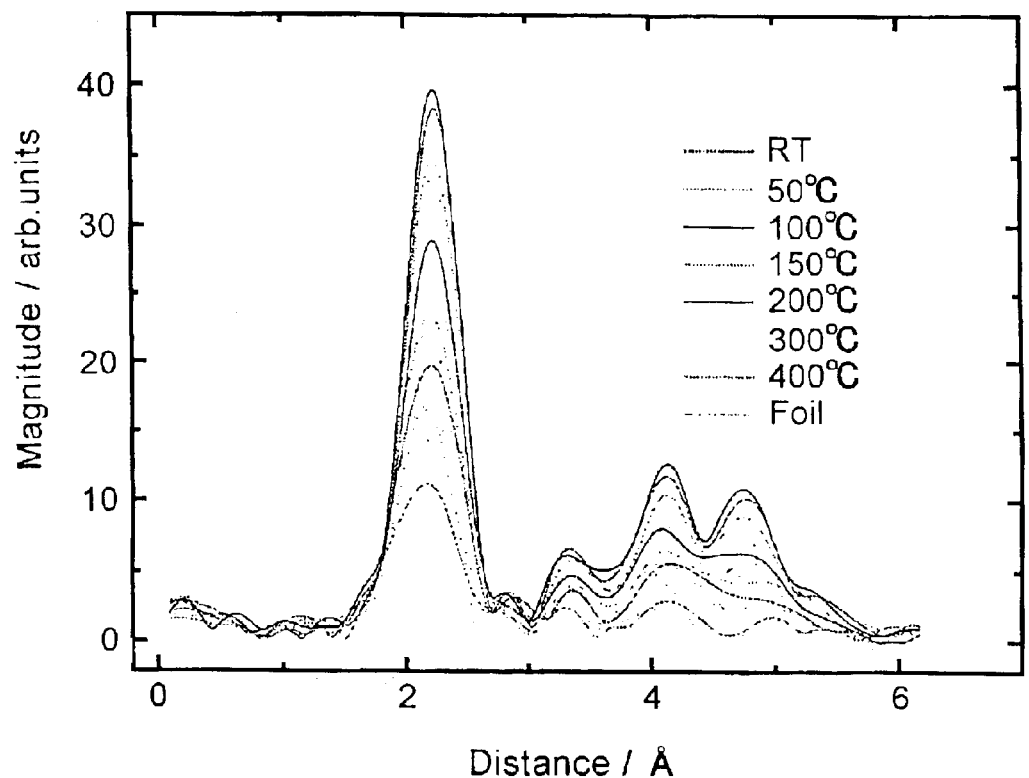
FIG. 11A is a graph showing the results of the experiment.
Figure 11B:
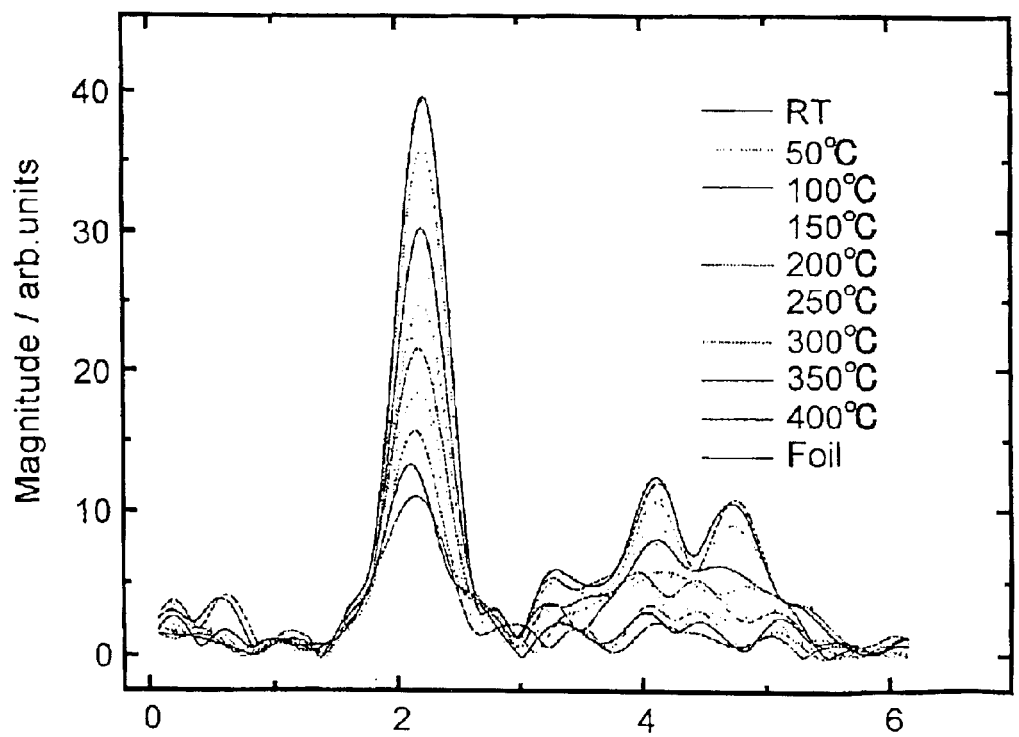
FIG. 11B is a graph showing the results of the experiment.

FIGS. 11A and 11B are graphs showing the results of the experiment. FIG. 11A shows the results of the experiment having been carried out to the second wiring layer 15b having a relatively large area, and FIG. 11B shows the results of the experiment having been carried out to the first wiring layer 15a having a relatively small area. In FIGS. 11A and 11B, an axis of ordinate indicates an existence rate of copper molecule, and an abscissa indicates a distance between copper molecule and a reference point in the unit of angstrom.

In FIGS. 11A and 11B, a peak indicates that copper molecule exists at the peak, and a height of a peak indicates an existence rate of copper molecule. As is obvious in view of FIGS. 11A and 11B, peaks are found at distances of about 2.2 angstroms, about 4.1 angstroms and about 4.8 angstroms. Accordingly, copper molecule exists at those distances.

The peaks are clearly observed at a temperature equal to or smaller than 100 degrees centigrade. In contrast, the peaks are not clearly observed at a temperature of 150 degrees centigrade or higher. This means that if annealed at a temperature equal to or greater than 150 degrees centigrade, copper molecules would significantly thermally oscillate, and accordingly, copper molecules would much obtain mobility, resulting in that copper molecules do not tend to be agglomerated, in other words, void is not likely to be generated.

Accordingly, it is understood that in order to prevent generation of void in the first wiring layer 15a, it is preferable that the first wiring layer 15a is annealed at a temperature equal to or greater than 150 degrees centigrade.

It was also found out that a preferable range of a thickness T of the first and second wiring layers 15a and 15b is 150 nanometers to 650 nanometers (150 nm $\leq$ T $\leq$ 650 nm).

The first wiring layer 15a is composed of copper in the above-mentioned experiment. The first wiring layer 15a may be composed of not only copper, but also a copper alloy containing copper predominantly.

For instance, the first wiring layer 15a may be composed of a copper alloy such as Cu—Al, Cu—Sn, Cu—Ag, Cu—Cr, Cu—Ti, Cu—Co or Cu—Mg. A mixture ratio of copper and other metals is determined in accordance with parameters such as a temperature at which the first wiring layer 15a is to be annealed, a width, a length and a thickness of each of the first and second wiring layers 15a and 15b.

As mentioned above, it is preferable that the first wiring layer 15a is annealed at a temperature equal to or greater than 150 degrees centigrade in order to prevent generation of void in the first wiring layer 15a. This is the case only when the first wiring layer 15a is composed only of copper.

The inventors have found out that the first wiring layer 15a is necessary to be annealed at a temperature higher than 150 degrees centigrade, if the first wiring layer 15a is composed of a copper alloy.

Specifically, if each of the first and second wiring layers 15a and 15b is composed of a copper alloy predominantly containing copper therein, the first and second wiring layers 15a and 15b may be annealed at a temperature higher than a temperature at which the first and second wiring layers 15a and 15b composed of copper is to be annealed.

The inventors had further found out a relation between a size of the via-contact 16 and an optimal width of the upper wiring layer 17 and the lower wiring layer 15 in the wiring structure illustrated in FIG. 9.

Specifically, it is preferable that a width of the upper and lower wiring layers 17 and 15 is set equal to a maximum diameter of a circle inscribed with the via-contact 16, in which the circle has a center identical with a center of the via-contact 16.

Figure 12A:
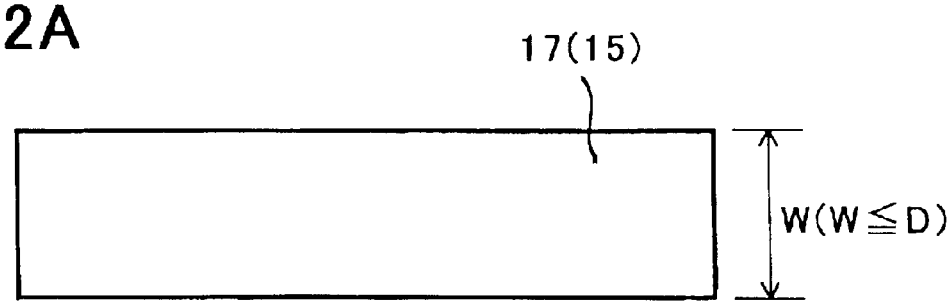
FIG. 12A is an upper view of upper and lower wiring layers.
Figure 12B:
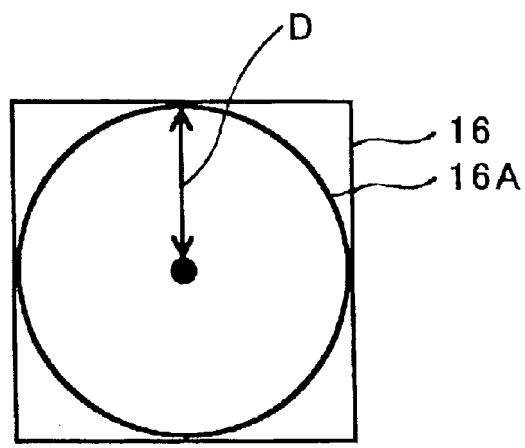
FIG. 12B is a cross-sectional view of a via-contact with a circle described so as to be inscribed with a cross-section of the via-contact.
Figure 12C:
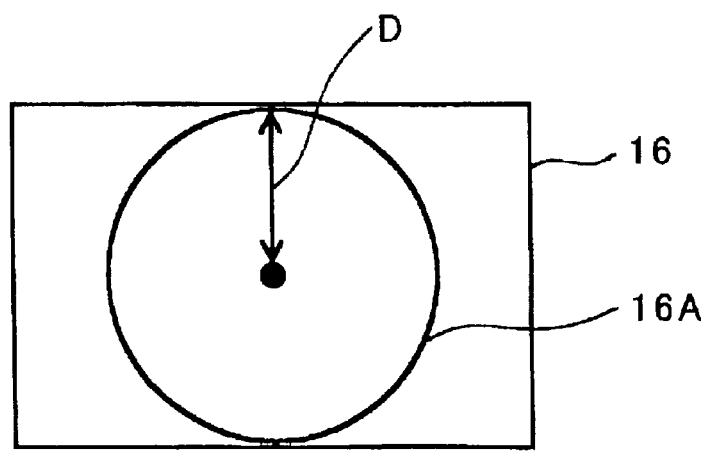
FIG. 12C is another cross-sectional view of a via-contact with a circle described so as to be inscribed with a cross-section of the via-contact.

FIG. 12A is an upper view of the upper and lower wiring layers 17 and 15, FIG. 12B is a cross-sectional view of the via-contact 16, and FIG. 12C is another cross-sectional view of the via-contact 16.

With reference to FIG. 12B, when the via-contact 16 has a square cross-section, a circle 16A is described in such a way that the circle 16A has a center identical with a center of the via-contact 16 and the circle 16A is inscribed with the via-contact 16. Assuming the thus described circle 16A has a diameter D, a width W of the upper and lower wiring layers 17 and 15 is defined so as to be equal to or smaller than the diameter D, as illustrated in FIG. 12A.

As illustrated in FIG. 12C, if the via-contact 16 has a rectangular cross-section, a circle 16A is described such that the circle 16A is inscribed with longer sides of the rectangular via-contact 16. Then, the diameter D of the circle 16A is determined.

In accordance with the experiments conducted by the inventors, the diameter D is preferably equal to 3 micrometers.

[Second Embodiment]

FIGS. 13A and 13B illustrate a wiring structure 20 in accordance with the second embodiment of the present invention.

FIG. 13A is a plan view of the wiring structure 20, and FIG. 13B is a cross-sectional view taken along the line 12B—12B in FIG. 13A.

The wiring structure 20 is applicable to a multi-layered wiring structure in a semiconductor device, for instance.

The wiring structure 20 in accordance with the second embodiment is comprised of a first lower wiring layer 21a, a second lower wiring layer 21b, an upper wiring layer 22 arranged above and across the first and second lower wiring layers 21a and 21b, a first via-conductor 23a electrically connecting the first lower wiring layer 21a and the upper wiring layer 22 to each other, and a second via-conductor 23b electrically connecting the second lower wiring layer 21b and the upper wiring layer 22 to each other.

The first and second lower wiring layers 21a and 21b, the upper wiring layer 22 and the first and second via-conductors 23a and 23b are all composed of copper.

Figure 1A:
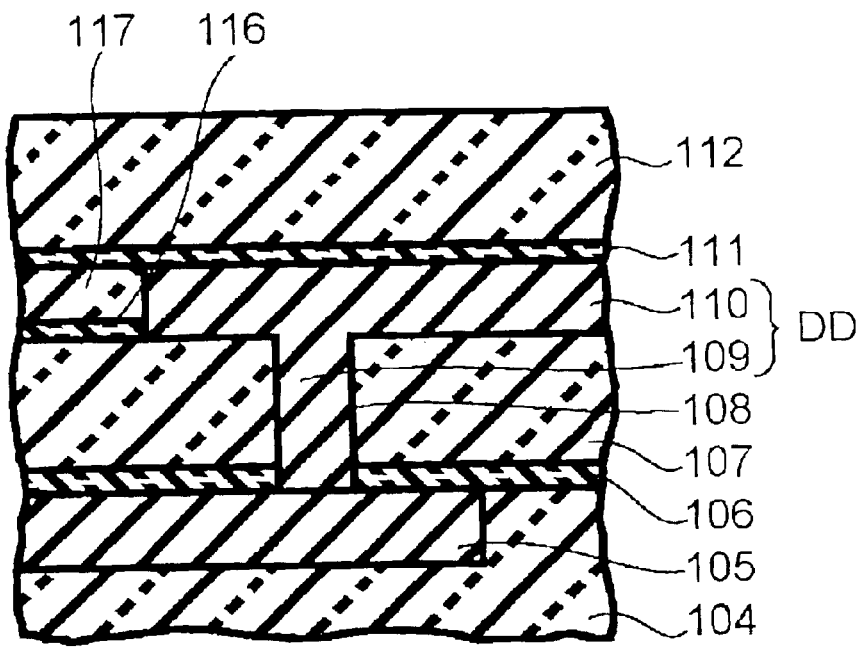
FIGS. 1A, 1B, 1C and 1D are cross-sectional views illustrating conventional wiring structures.
Figure 1B:
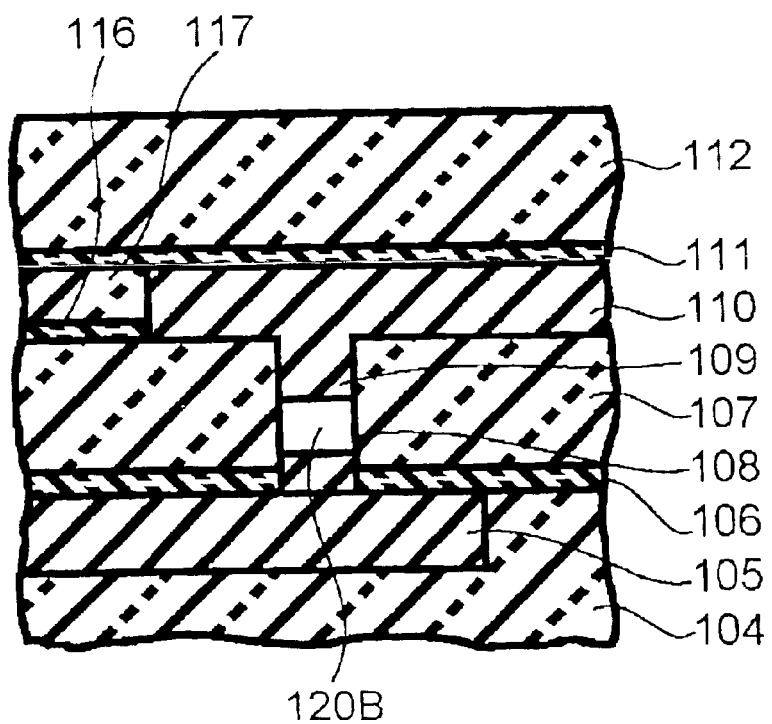
Figure 1C:
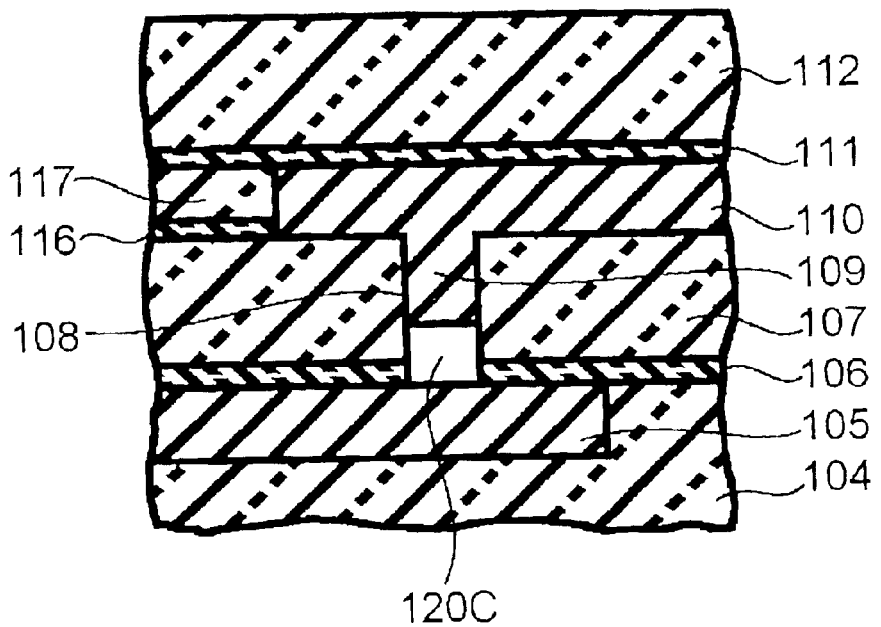
Figure 1D:
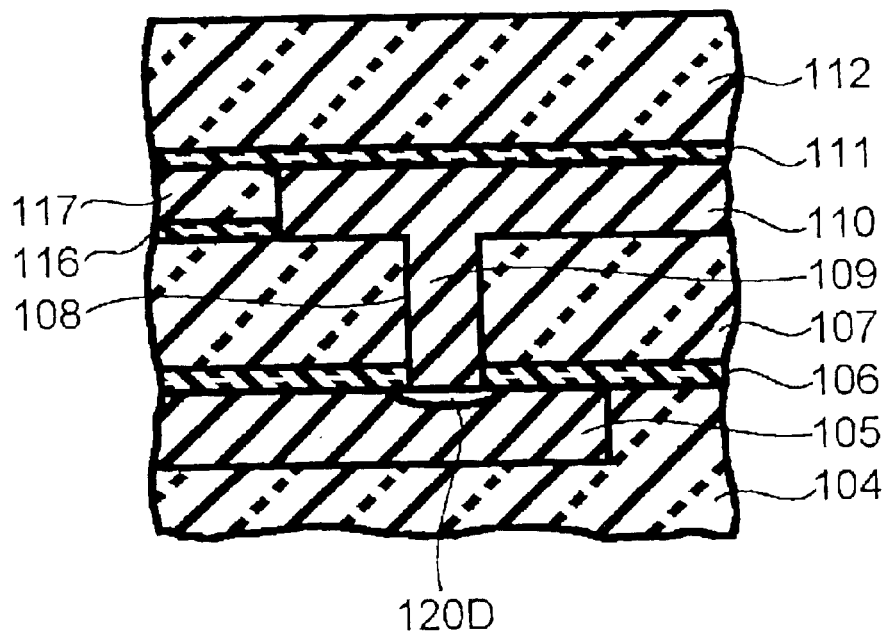
Figure 2:
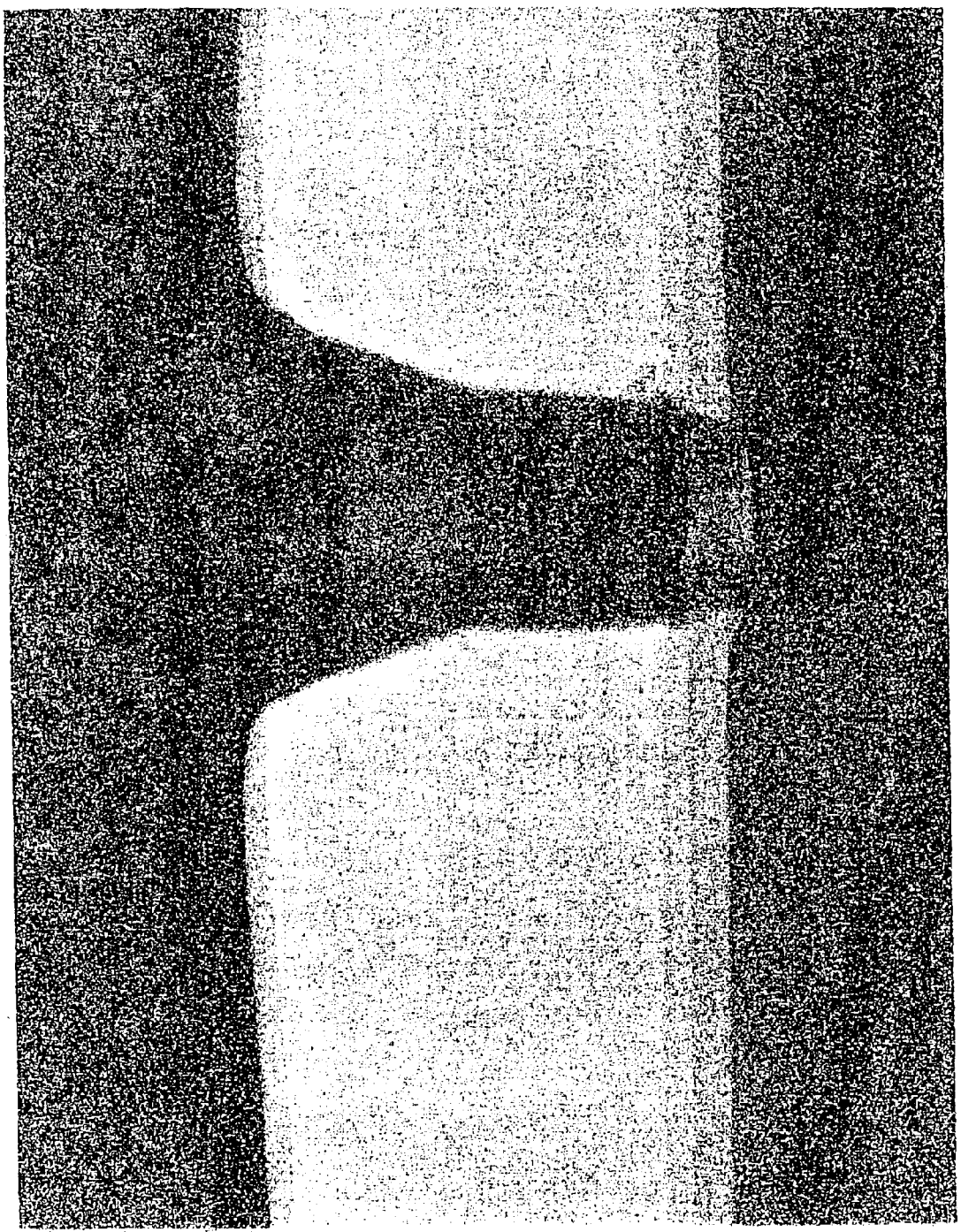
FIG. 2 is a photograph of void generated at a bottom of a via-hole, taken through an electron-microscope.
Figure 3:
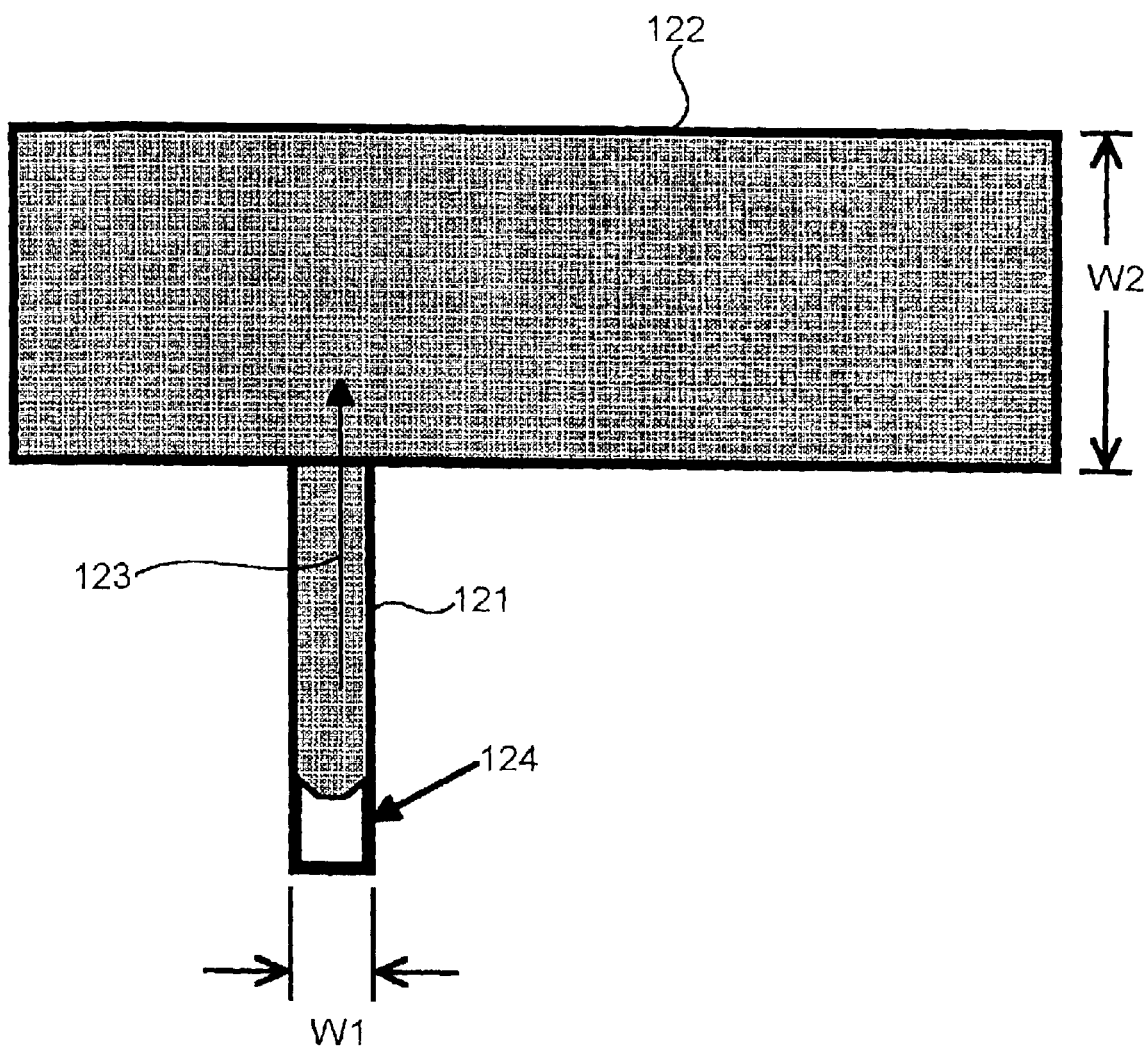
FIG. 3 is a plan view illustrating void generated in a conventional copper wiring structure.
Figure 4A:
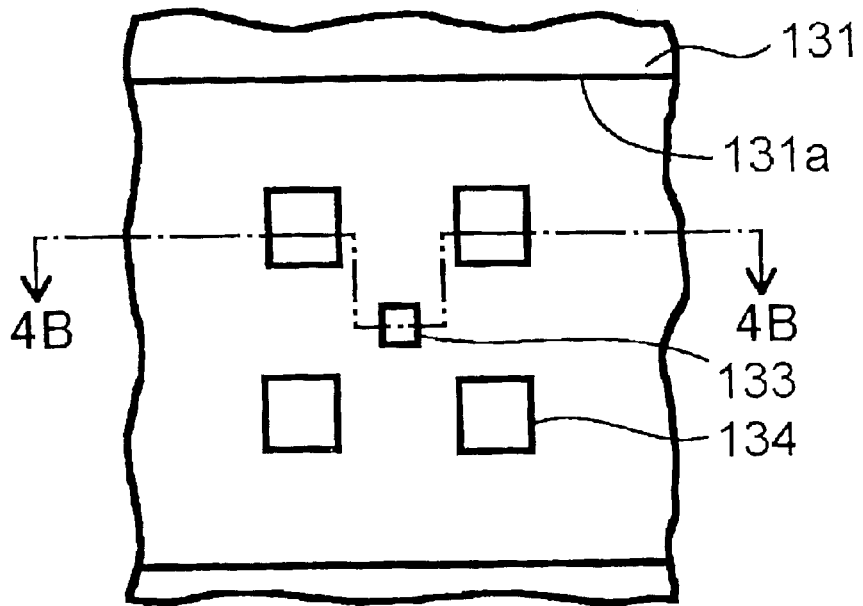
FIG. 4A is an upper plan view of a conventional damascene wiring structure.
Figure 4B:
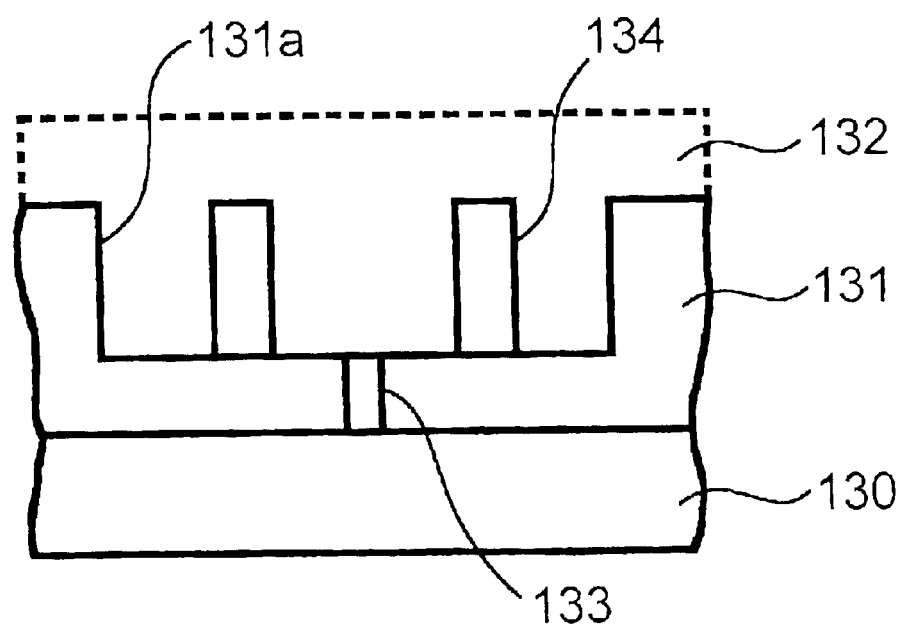
FIG. 4B is a cross-sectional view taken along the line 4B—4B in FIG. 4A.

The first and second lower wiring layers 21a and 21b have the same structure as the structure of the wiring structure 10 in accordance with the first embodiment, illustrated in FIGS. 4 and 7.

The upper wiring layer 22 has rectangular longitudinal and latitudinal cross-sections. That is, the upper wiring layer 22 is a cube in shape, and has a volume V2.

The first and second via-conductors 23a and 23b have an almost square latitudinal cross-section. That is, each of the first and second via-conductors 23a and 23b is a cube in shape, and has a volume V1.

As mentioned earlier, if the volume V2 is significantly greater than the volume V1 (V2>>V1), copper of which the first and second via-conductors 23a and 23b are composed is agglomerated, and hence, the first and second via-conductors 23a and 23b each having the volume V1 is absorbed into the upper wiring layer 22 having the volume V2, resulting generation of void in the first and second via-conductors 23a and 23b.

In view of this problem, the inventors had conducted the experiments in order to find a critical ratio between the volumes V1 and V2 at which copper of which the first and second via-conductors 23a and 23b are not agglomerated, that is, the first and second via-conductors 23a and 23b are not absorbed into the upper wiring layer 22.

In the above-mentioned first embodiment, the volume ratio N was determined in a two-dimensional planar wiring structure. In contrast, in the second embodiment, a volume ratio N is determined in a three-dimensional multi-layered wiring structure.

In a two-dimensional planar wiring structure, copper of which a wiring layer is composed is agglomerated in two directions, that is, X and Y directions. In contrast, in a three-dimensional multi-layered wiring structure, copper of which a wiring layer is composed is agglomerated in three directions, that is, X, Y and Z directions. Accordingly, mechanism of copper migration and a critical volume ratio N in a three-dimensional multi-layered wiring structure is slightly different from those in a two-dimensional planar wiring structure.

In accordance with the results of the experiments, it was found out that it was possible to avoid migration of copper in the first and second via-conductors 23a and 23b, and hence, absorption of the first and second via-conductors 23a and 23b into the upper wiring layer 22 by setting a volume ratio N equal to or greater than 3, but equal to or smaller than 200,000,000 ($3 \leq N \leq 200,000,000$) where the volume ratio N is defined as V2/V1.

It was also found out that an optimal range in the volume ratio N was 2,000 to 2,000,000 among the above-mentioned range of 3 to 200,000,000 in the volume ratio N.

Furthermore, the inventors considered that if the first and second via-conductors 23a and 23b were designed to have a square cross-section, they would have an optimal length of a side of the square cross-section. Hence, the inventors had conducted experiment in order to find such an optimal length of a side of the square cross-section.

Figure 14:
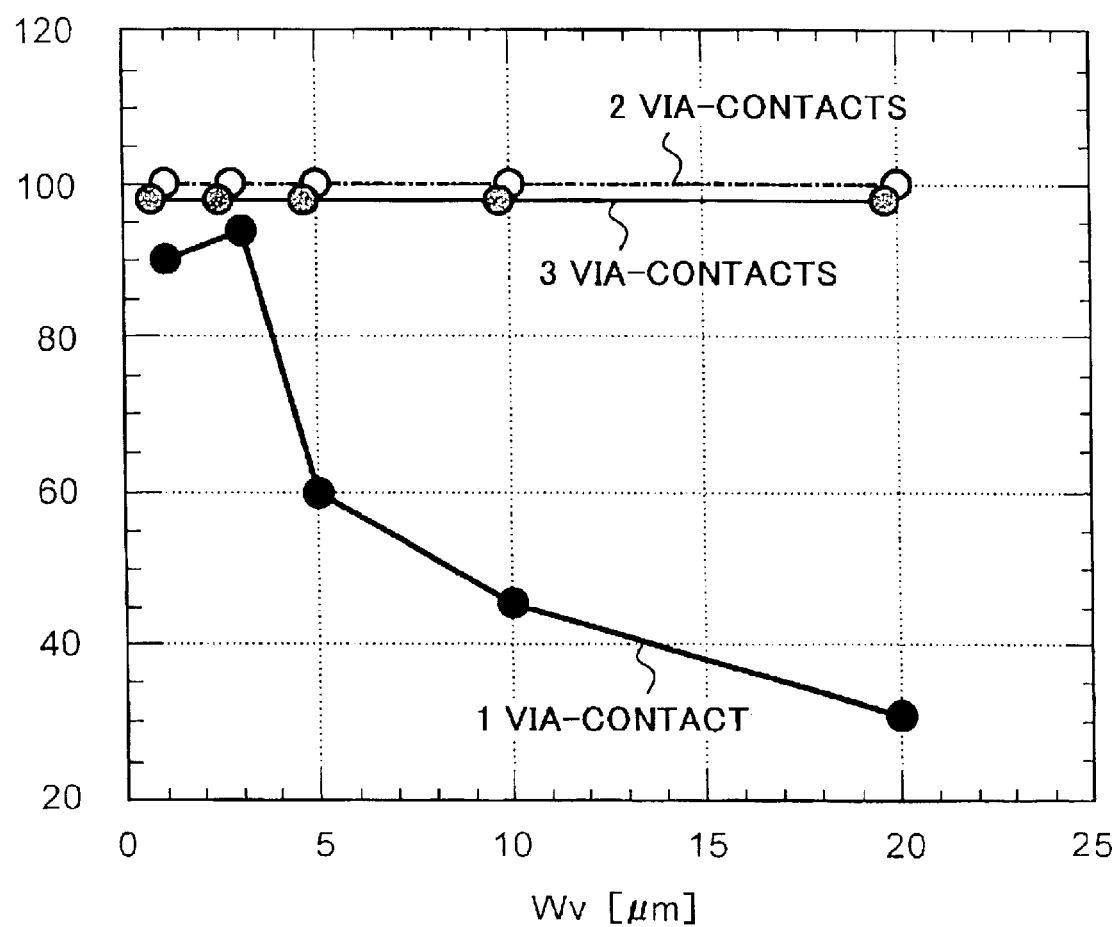
FIG. 14 is a graph showing a relation between a width of a via-conductor and a non-defectiveness rate.

FIG. 14 is a graph showing the results of the experiment. In FIG. 14, an abscissa indicates a length of a side of a square cross-section, and an axis of ordinate indicates a non-defectiveness rate of a wiring structure.

As is obvious in view of FIG. 14, if a length of a side of the square cross-section is equal to or smaller than 3 micrometers, a non-defectiveness rate remains almost 100%. In contrast, if a length of a side of the square cross-section is over 3 micrometers, a non-defectiveness rate is decreased. For instance, if a length of a side of the square cross-section is equal to 20 micrometers, a non-defectiveness rate is decreased down to about 28%.

As is obvious in view of the explanation having been made above, it is necessary that a length of a side of the square cross-section of the first and second via-conductors 23a and 23b is equal to or smaller than 3 micrometers, in order to keep a non-defectiveness rate at 100%.

A non-defectiveness rate is about 80% when a length of a side of the square cross-section of the first and second via-conductors 23a and 23b is equal to 4 micrometers. Accordingly, it is necessary that a length of a side of the square cross-section of the first and second via-conductors 23a and 23b is equal to or smaller than 4 micrometers, in order to keep a non-defectiveness rate at 80%.

When the volume ratio N is equal to or greater than 3.5, but equal to or smaller than 2,000,000 ($3.5 \leq N \leq 2,000,000$) in the case that the upper wiring layer 22 is electrically connected to the first and second lower wiring layers 23a and 23b through the single via-conductor 23a and 23b, it would be preferable that the upper wiring layer 22 is electrically connected to the first lower wiring layer 21a or the second lower wiring layer 21b through two or more via-contacts.

As is obvious in FIG. 14, it was found out that the yield could be enhanced by forming two or move via-contacts. In FIG. 14, each of the via-contacts is designed to have a diameter of 0.14 micrometers.

When agglomeration as one of physical phenomenon takes place, metal atoms move such that surface energy is minimized. In agglomeration, if an area of a larger volume having lower energy than an area of a smaller volume in question becomes larger, the area of a smaller volume would have smaller stability. Accordingly, in order to suppress agglomeration, it would be preferable to have a countermeasure against a physically infinite volume. In this sense, it would be preferable to format least two via-contacts.

The upper limit number of via-holes can be experimentally determined.

Though the first and second lower wiring layers 23a and 23b are designed to have a square cross-section in the above-mentioned example, the first and second lower wiring layers 23a and 23b may be designed to have a circular cross-section.

When the first and second lower wiring layers 23a and 23b are designed to have a circular cross-section, the results of the experiments having been conducted by the inventors indicate that a diameter of the circular cross-section is preferably equal to or smaller than 0.28 micrometers, more preferably equal to or smaller than 0.20 micrometers, further more preferably equal to or smaller than 0.14 micrometers, and most preferably equal to or smaller than 98 nanometers.

The above-mentioned diameters of the first and second lower wiring layers 23a and 23b may have tolerance of ±0.04 micrometers. Specifically, when the first and second lower wiring layers 23a and 23b is designed to have a circular cross-section, a diameter of the first and second lower wiring layers 23a and 23b is preferably 0.28±0.04 micrometers, more preferably 0.20±0.04 micrometers, further more preferably 0.14±0.04 micrometers, and most preferably 98 nanometers ±0.04 micrometers.

As mentioned later, a preferable volume ration N varies in dependence on a diameter of the first and second lower wiring layers 23a and 23b.

Hereinbelow is explained an example of a wiring structure to which the wiring structure 20 in accordance with the second embodiment is applied, with reference to FIGS. 15A to 15D.

Figure 15A:
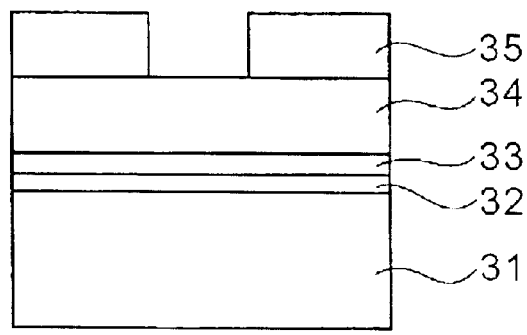
FIGS. 15A to 15D are cross-sectional views of a wiring structure, illustrating respective steps of a method of fabricating the same.

First, as illustrated in FIG. 15A, an electrically insulating film 32 is formed on a silicon substrate 31 on which a transistor (not illustrated) and a contact (not illustrated) have been already formed.

Then, a $SiN_4$ film 33 is formed on the electrically insulating film 32 by the thickness of about 50 nanometers. Then, a planarized insulating film 34 comprised of a silicon dioxide film is formed on the SiN$_4$ film 33 by the thickness of about 400 nanometers.

Then, an inversely-patterned resist mask 35 is formed on the planarized insulating film 34 by photolithography and etching.

Figure 15B:
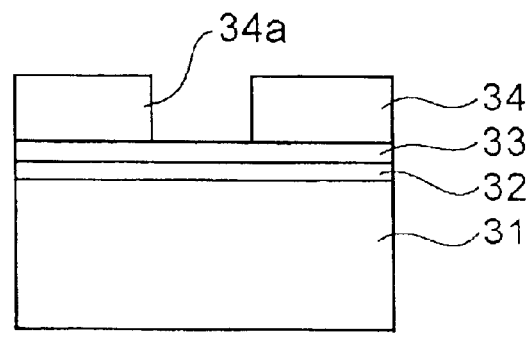

Then, as illustrated in FIG. 15B, the silicon dioxide film 34 is etched through the resist mask 35 to thereby form a recess 34a.

Figure 15C:
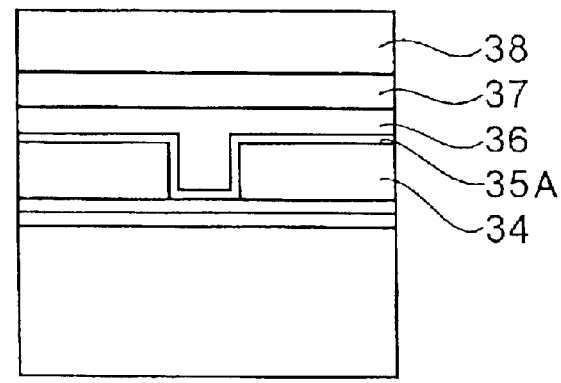

After removal of the resist mask 35, as illustrated in FIG. 15C, a refractive metal film 35A containing nitrogen therein, such as a TaN film, is formed all over the silicon dioxide film 34 and an exposed portion of the SiN$_4$ film 33 by the thickness of about 20 nanometers.

Then, copper 36 is deposited over the refractive metal film 35A by the thickness of about 0.1 micrometers.

Then, a copper film 37 is formed on the copper 36 by the thickness of 100 nanometers by sputtering.

Then, a copper film 38 is formed on the copper film 37 by the thickness of 800 nanometers by plating.

Figure 15D:
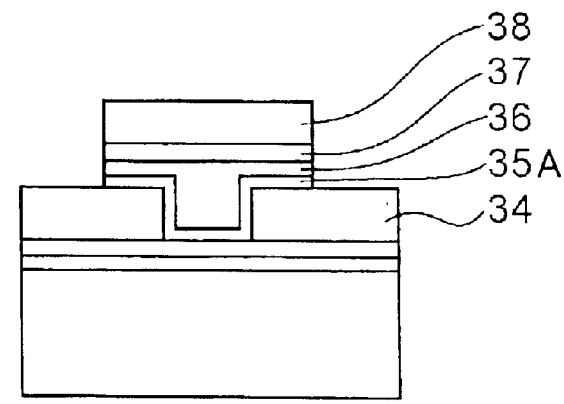

Then, the copper films 38 and 37, the copper 36 and the refractive metal film 35 are etched back by chemical mechanical polishing (CMP). Thus, there is obtained such a wiring structure as illustrated in FIG. 15D.

The inventors had estimated that the preferable volume ratio N in the wiring structure 20 illustrated in FIGS. 13A and 13B varied in dependence on a volume of the first or second via-conductor 23a or 23b, and had conducted the experiment to verify the estimate.

Figure 16:
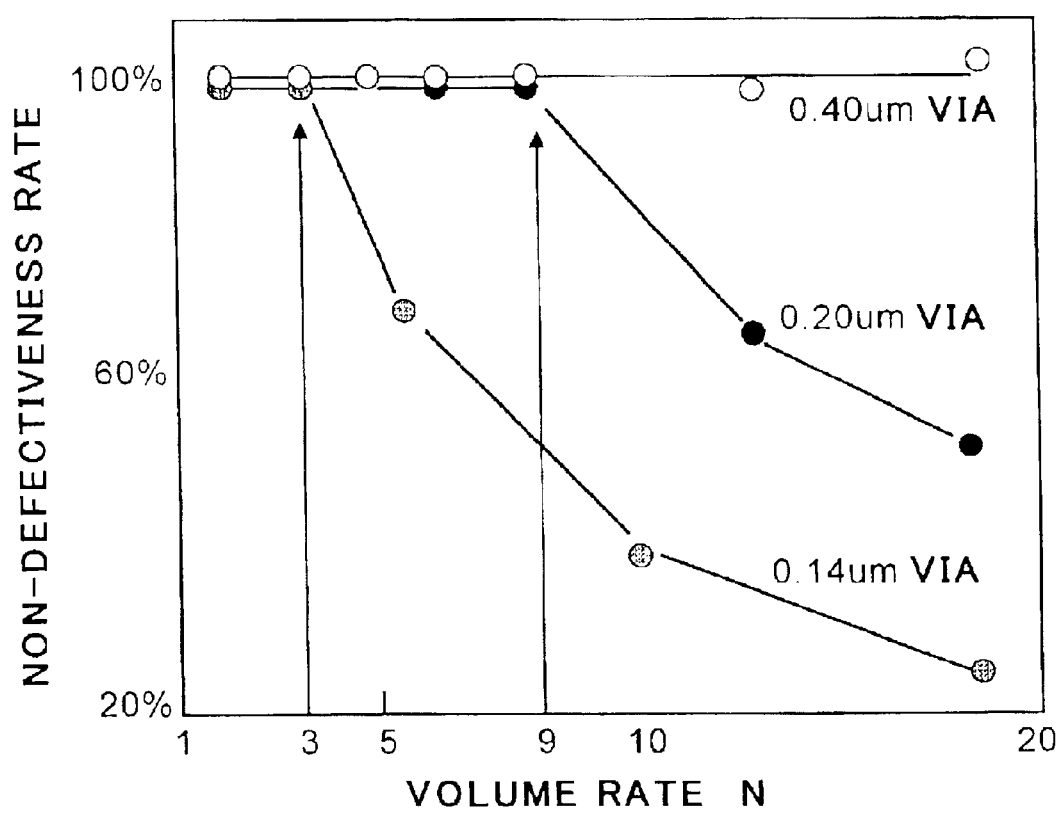
FIG. 16 is a graph showing a relation between a size of a via-conductor and a non-defectiveness rate.

The results of the experiment are shown in FIG. 16. FIG. 16 is a graph showing a relation between a volume ratio N and a non-defectiveness rate in the wiring structure 20 illustrated in FIGS. 13A and 13B in the case that the first or second via-conductor 23a or 23b is designed to have a circular cross-section.

In the experiment, four first via-conductors 23a having a circular cross-section were formed. They had diameters of 0.14 micrometers, 0.20 micrometers, 0.28 micrometers and 0.40 micrometers. A non-defectiveness rate was measured for each of the four first via-conductors 23a while the volume ratio N was gradually varied.

As illustrated in FIG. 16, thermal stress was increased and a non-defectiveness rate was lowered for the first via-conductor 23a having a smaller diameter.

In the first via-conductor 23a having a diameter of 0.14 micrometers, a non-defectiveness rate remained 100% when the volume ratio N was equal to or smaller than three (3), but a non-defectiveness rate was decreased, if the volume ratio N was over three (3).

Accordingly, it was found out that the volume rate N was preferably equal to or smaller than three (3) when the first via-conductor 23a was designed to have a circular cross-section having a diameter of 0.14 micrometers.

In the first via-conductor 23a having a diameter of 0.20 micrometers, a non-defectiveness rate remained 100% when the volume ratio N was equal to or smaller than nine (9), but a non-defectiveness rate was decreased, if the volume ratio N was over nine (9).

Accordingly, it was found out that the volume rate N was preferably equal to or smaller than nine (9) when the first via-conductor 23a was designed to have a circular cross-section having a diameter of 0.20 micrometers.

In the first via-conductor 23a having a diameter of 0.28 micrometers, a non-defectiveness rate remained 100% when the volume ratio N was equal to or smaller than fifteen (15), but a non-defectiveness rate was decreased, if the volume ratio N was over fifteen (15).

Accordingly, it was found out that the volume rate N was preferably equal to or smaller than fifteen (15) when the first via-conductor 23a was designed to have a circular cross-section having a diameter of 0.28 micrometers.

With respect to the first via-conductor 23a having a diameter of 0.40 micrometers, a non-defectiveness rate remained 100% independently of the volume rate N within a range of the volume rate N having been measured in the experiment.

Accordingly, it is considered that when the first via-conductor 23a is designed to have a circular cross-section having a diameter of 0.40 micrometers, the volume rate N can be set equal to any rate without any restriction.

The same results as mentioned above were obtained, even if the diameters of the first via-conductor 23a, that is, 0.14 micrometers, 0.20 micrometers, 0.28 micrometers and 0.40 micrometers had an error of ±0.04 micrometers. Accordingly, when the first via-conductor 23a is designed to have a diameter of 0.14±0.04 micrometers, 0.20±0.04 micrometers, 0.28±0.04 micrometers or 0.40±0.04 micrometers, the volume rate N may be set equal to or smaller than 3, 9 and 15, and equal to any rate, respectively.

It should be noted that a ratio having been explained above for a three-dimensional structure may be applied to a two-dimensional structure.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-051803 filed on Feb. 27, 2001 including specification, claims, drawings and summary is incorporated herein by reference in its entirety.

What is claimed is:

1. A wiring structure including an upper wiring layer, and a lower wiring layer electrically connected to said upper wiring layer through a via contact,
    wherein all of said upper wiring layer, said lower wiring layer and said via contact are composed of copper or an alloy predominantly containing copper therein,
    a ratio in volume of at least one of said upper and lower wiring layers to said via contact is N:1 where N is equal to or smaller than 9, and
    said via contact has a diameter equal to or smaller than 0.20 micrometers.

2. The wiring structure as set forth in claim 1, wherein N is equal to or smaller than 3, and said via contact has a diameter equal to or smaller than 0.14 micrometers.

3. The wiring structure as set forth in claim 1, wherein a wiring width of each of said upper and lower wiring layers is defined by a maximum diameter of a circle inscribed with said via contact, said circle having a center identical with a center of said via contact.

4. The wiring structure as set forth in claim 1, wherein said upper and lower wiring layers are annealed at a temperature equal to or higher than 150° C.

5. The wiring structure as set forth in claim 1, wherein if said upper and lower wiring layers are composed of an alloy predominantly containing copper therein, said upper and lower wiring layers are annealed at a temperature higher than a temperature at which said upper and lower wiring layers are annealed if said upper and lower wiring layers are composed of copper.

6. The wiring structure as set forth in claim 2, wherein a wiring width of each of said upper and lower wiring layers is defined by a maximum diameter of a circle inscribed with said via contact, said circle having a center identical with a center of said via contact.

7. The wiring structure as set forth in claim 2, wherein said upper and lower wiring layers are annealed at a temperature equal to or higher than 150° C.

8. The wiring structure as set forth in claim 2, wherein if said upper and lower wiring layers are composed of an alloy predominantly containing copper therein, said upper and lower wiring layers are annealed at a temperature higher than a temperature at which said upper and lower wiring layers are annealed if said upper and lower wiring layers are composed of copper.

* * * * *